United States Patent [19]
Hsue et al.

[11] Patent Number: 5,380,675
[45] Date of Patent: Jan. 10, 1995

[54] METHOD FOR MAKING CLOSELY SPACED STACKED CAPACITORS ON DRAM CHIPS

[75] Inventors: Chen-Chiu Hsue; Gary Hong, both of Hsin-Chu, Taiwan, Prov. of China

[73] Assignee: United Microelectronics Corporation, Hsinchu, Taiwan, Prov. of China

[21] Appl. No.: 210,933

[22] Filed: Mar. 21, 1994

[51] Int. Cl.⁶ .................... H01L 21/70; H01L 27/00
[52] U.S. Cl. .................... 437/52; 437/60; 437/919
[58] Field of Search .................... 437/47, 52, 60, 919

[56] References Cited

U.S. PATENT DOCUMENTS

| | | | |
|---|---|---|---|
| 4,977,102 | 12/1990 | Ema | 437/60 |
| 5,061,650 | 10/1991 | Dennison et al. | 437/47 |
| 5,066,604 | 11/1991 | Chung et al. | 437/968 |
| 5,162,881 | 11/1992 | Ohya | 257/309 |
| 5,192,702 | 3/1993 | Tseng | 437/47 |
| 5,262,343 | 11/1993 | Rhodes et al. | 437/52 |
| 5,266,514 | 11/1993 | Tuan et al. | 437/52 |

OTHER PUBLICATIONS

"A Newly Designed Planar Stacked Capacitor Cell with High Dielectric Constant Film for 256 Mbit DRAM" by T. Eimori et al, IEEE International Electron Device Meeting Proceedings, Dec. 1993, pp. 631–634.

Primary Examiner—George Fourson
Assistant Examiner—H. Jey Tsai
Attorney, Agent, or Firm—George O. Saile

[57] ABSTRACT

A method for fabricating an array of closely spaced storage capacitors, with increased capacitance, on a dynamic random access memory (DRAM) chip is achieved. The capacitors are increased in capacitance by minimizing the spacings between the adjacent bottom electrodes of the storage capacitors and, thereby increases the area of the capacitor electrodes. A local oxidation techniques is used to form a silicon oxide etch mask, on the bottom electrode polysilicon layer, that extends laterally under a patterned silicon nitride masking layer. This encroachment of the silicon oxide under the patterned silicon nitride layer reduces the spacing between electrodes, exceeding the resolution limits of the photoresist. The silicon nitride is removed and the silicon oxide mask is used to pattern the polysilicon layer forming an array of closely spaced polysilicon bottom electrodes. The silicon oxide is removed and an inter-electrode dielectric is deposited on the array of bottom electrode. A second doped polysilicon layer is then deposited to form the top electrode and complete the DRAM capacitors.

38 Claims, 4 Drawing Sheets

METHOD FOR MAKING CLOSELY SPACED STACKED CAPACITORS ON DRAM CHIPS

BACKGROUND OF THE INVENTION (1) Field of the Invention

This invention relates to a random access memory device and, more particularly, to a method of forming an array of closely spaced stacked capacitors having increased capacitance.

(2) Description of the Prior Art

Very large scale integration (VLSI) semiconductor technologies have dramatically increased the circuit density on the chip. The miniaturized devices built in and on the semiconductor substrate, making up these circuits, are very closely spaced and their packing density has increased significantly. Future requirements for even greater increases in packing density is putting additional demand on the semiconductor technologies and more particularly on the photolithographic techniques.

One such circuit element experiencing increasing demand for higher packing density is the array of storage cells on a dynamic random access memory (DRAMs) chip. These individual DRAM storage cells, consisting usually of a single metal-oxide-semiconductor field-effect transistor (MOSFET) and a single capacitor, are used extensively in the electronics industry for storing data. A single DRAM storage cell stores a bit of data on the capacitor as electrical charge.

However, as the array of cells on the DRAM chip increase in number and the capacitor decrease in size, it becomes increasingly difficult to maintain sufficient charge on the storage capacitor to maintain an acceptable signal-to-noise level. Also, these volatile storage cells require more frequent refresh cycles to retain their charge.

These storage capacitors can be formed either in the substrate, usually referred to as trench capacitors, or by forming stacked capacitors on the substrate after first fabricating the field effect transistors. The latter method has received considerable attention in recent years. However, since each capacitor in the array of storage cells are confined within the cell area, it is difficult to maintain sufficient capacitance as the cell size decreases. Therefore, it becomes necessary to explore other methods for increasing the capacitance.

Some methods for increasing capacitance include, building a three dimensional capacitor structure extending vertically upward over the cell area. For example, see H-H Tseng U.S. Pat. No. 5,192,702 and C. H. Dennison et al U.S. Pat. No. 5,061,650. Another approach is to roughen the surface of the bottom electrode of the capacitor to effectively increase the surface area without increasing its overall size. For example, see H. C. Tuan et al U.S. Pat. No. 5,266,514. Still another approach is to use interelectrode insulators having high dielectric constants. For example see the publication "A Newly Designed Planar Stacked Capacitor Cell with High Dielectric Constant Film for 256 Mbit DRAM" by T. Eimori et al IEEE International Electron Device Meeting Proceedings, December 1993 pages 631–634.

However, it is still desirable to retain as simple a process as possible to maintain high chip yields, low cost and good reliability. Also, it would be very desirable to extend the resolution of current photolithographic limits to reduce the spacing between adjacent cell capacitors while increasing the capacitor area and at the same time taking advantage of the other technologies, such as roughened surface area and using interelectrode high dielectric insulators.

SUMMARY OF THE INVENTION

It is the principal object of this invention to increase the capacitance of the individual capacitors by extending the perimeter of the bottom electrodes and by forming an upward sloping surface.

It is another object of the present invention to provide a method for fabricating an array of DRAM stacked storage capacitors having very narrow spacing between adjacent capacitors extending the current limits of photolithograghic resolution.

It is still another object of the invention to further increase the capacitance by roughening the surface of the bottom electrode and allowing the use of high dielectric insulators.

This invention addresses these objects by teaching a method for decreasing the spacings between adjacent storage capacitors and thereby increasing the capacitor area. To accomplish the objectives of the present invention, a local oxidation technique is applied to a polysilicon layer for forming the bottom electrode of the DRAM cell storage capacitors.

In summary then, after forming an array of active device areas surrounded and isolated from each other by a relatively thick field oxide, a passing transistor is formed in each active device region. The transistor is usually a field effect transistor (MOSFET) having source/drain contacts. The gate electrode of the transistor is usually formed from a doped polysilicon layer, which is patterned using conventional photolithographic techniques and etching. This patterned polysilicon layer also serves as the word line conductors elsewhere on the DRAM chip. After electrically insulating the gate electrode and the word line, a bit line electrical contact is made to one of the two source/drain contacts, also using a patterned doped polysilicon layer. This patterned polysilicon layer also serves as the bit line conductors elsewhere on the DRAM chip. Next, an insulating layer, usually composed of silicon dioxide and silicon nitride, is formed over the bit line polysilicon pattern and contact openings are made to the other source/drain contacts. These contacts are now used to make electrical contact to the bottom electrodes of the stacked capacitors. The contacts are commonly referred to as the capacitor node contacts.

The bottom electrode of the stacked capacitor is then formed by depositing a relatively thick polysilicon layer having an oxidation retarding layer deposited thereon, such as silicon nitride. This silicon nitride layer is then patterned, forming an array of openings over the desired capacitor electrode areas and having silicon nitride between and around each electrode area of the array. A local oxidation technique is then used to partially oxidize the polysilicon layer in the electrode areas forming a relatively thick silicon oxide, extending laterally and partially under the silicon nitride. This lateral extending oxidation reduces further the spacings between electrodes, and increases the electrode area. This effectively extends further the current resolution of the photoresist technology. Now after removing the nitride layer and using the oxidation layer 50 as an etch mask the polysilicon layer 46 is selectively etched to the underlying silicon nitride layer 44. This forms an array of electrically isolated and closely spaced bottom electrodes. The polysilicon oxidation layer 50 is now removed. The thermal oxidation roughens the electrode surface further increasing the surface area. A high dielectric insulating layer is deposited to form the inter-electrode insulator and a second polysilicon layer, appropriately doped, is deposited to complete the array of stacked storage capacitors.

BRIEF DESCRIPTION OF THE DRAWINGS

The objects and advantages of this invention are best understood by the embodiment with reference to the attached drawings which are now briefly described.

DESCRIPTION OF THE PREFERRED EMBODIMENTS

Now in keeping with the objects of this invention, the method for forming an array of closely spaced storage capacitors is covered in detail. The sequence of fabrication steps are shown in FIGS. 1 to 6. This array of storage capacitors can be fabricated on MOSFET structures which are currently used in manufacturing of DRAMS. Therefore, only a brief description of the underlying structure is given, sufficient for understanding the current invention.

It should also be well understood by one skilled in the art that by including additional process steps, in addition to those described in this embodiment, other type of devices can also be included on the DRAM chip, For example, P channel MOSFETs can be formed by providing N-Wells in the P substrate and CMOS circuits can also be formed therefrom.

Figure 1:
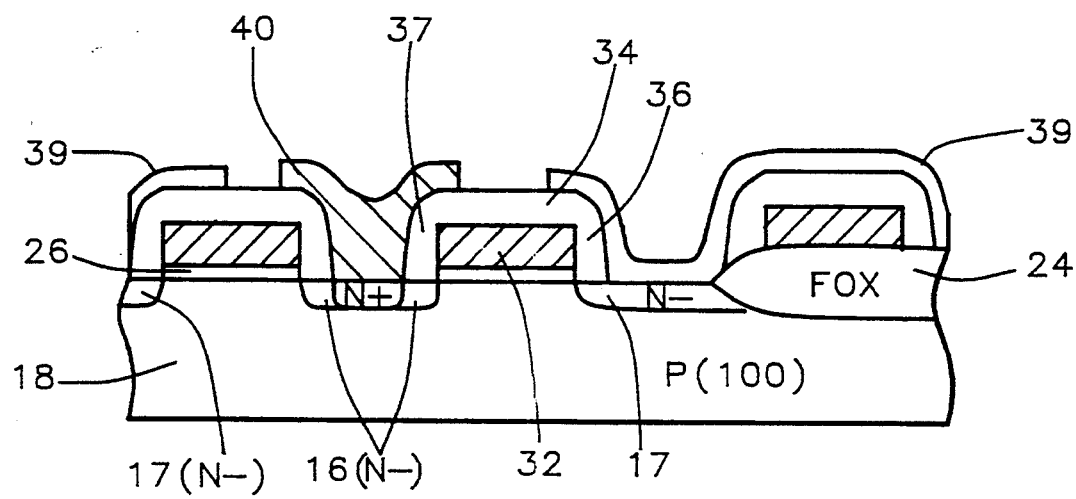
FIG. 1 is a cross-sectional view of the partially completed DRAM cell prior to forming the stacked capacitor structure. Shown is a portion of the field oxide, the field effect transistor and the contact portion of the bit line polysilicon.

Referring now to FIG. 1, a cross-sectional view of the substrate 18 having a partially completed DRAM cell formed on and in the substrate surface, is schematically shown. The preferred substrate is composed of a P-type single crystal silicon having a <100> crystallographic orientation. A relatively thick Field Oxide (FOX) 24 is formed around the active device regions to isolate these individual device regions. This field oxide, only partially shown in FIG. 1, is formed by depositing a thin silicon oxide (pad oxide) and a thicker silicon nitride layer as an oxidation barrier layer. Conventional photolithographic techniques and etching are then used to remove the barrier layer in areas where a field oxide is desired while retaining the silicon nitride areas where active device are to be fabricated. The silicon substrate is then oxidized to form the field oxide. The preferred thickness is between about about 4500 to 5500 Angstroms.

The semiconductor device is then formed in the active device regions after removing the silicon nitride barrier layer and pad oxide in a wet etch. The most commonly used device for dynamic random access memory is the metal-oxide-semiconductor field-effect transistor (MOSFET). This device is formed by first thermal oxidizing the active device region to form a thin gate oxide 26. The preferred thickness being from about 90 to 200 Angstroms. An appropriately doped polysilicon layer 32 and an insulating layer 34 are deposited and conventional photolithographic techniques and etching are used to pattern the insulator 34 and polysilicon 32. This forms the gate electrode 32 for each MOSFET in the active device regions and conducting patterns elsewhere on the substrate. These conducting patterns form the word lines that electrically connect the MOSFET gate electrode to the appropriate peripheral circuits on the DRAM chip. The lightly doped source/drain 16, 17 are formed next, usually by implanting a N-type species such as arsenic or phosphorus. For example, a typical implant might consist of phosphorus $p^{31}$ at a dose of between 1 E 13 to 10 E 13 atoms/cm$^2$ and an energy of between about 30 to 80 Kev.

After forming the lightly doped source/drain, sidewall spacers 36 and 37 are formed on the gate electrode sidewalls. These sidewall spacers are formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher.

A thin silicon oxide layer 39 of about 300 to 500 Angstroms is deposited by chemical vapor deposited (CVD) TEOS to protect region 17 when the polysilicon layer 40 is deposited and patterned by etching.

In this embodiment the bit line is formed next. The bit line contact is formed by depositing a polysilicon layer 40 which is appropriately doped N-type. Conventional photolithographic techniques and etching are used to pattern the polysilicon, forming a contact to one of the two source/drain contacts on the MOSFET, as shown in FIG. 1 and elsewhere over the substrate to provide electrically connections to the appropriate peripheral circuits on the chip. This completes the basic device structure upon which the storage capacitor is built.

The remainder of this embodiment relates more specifically to the objects of this invention, which addresses in detail the formation of an array of closely spaced bottom electrodes. The invention utilizes a local silicon oxidation method that reduces the spacing between adjacent storage capacitors and correspondingly increases the capacitor area.

Figure 2:
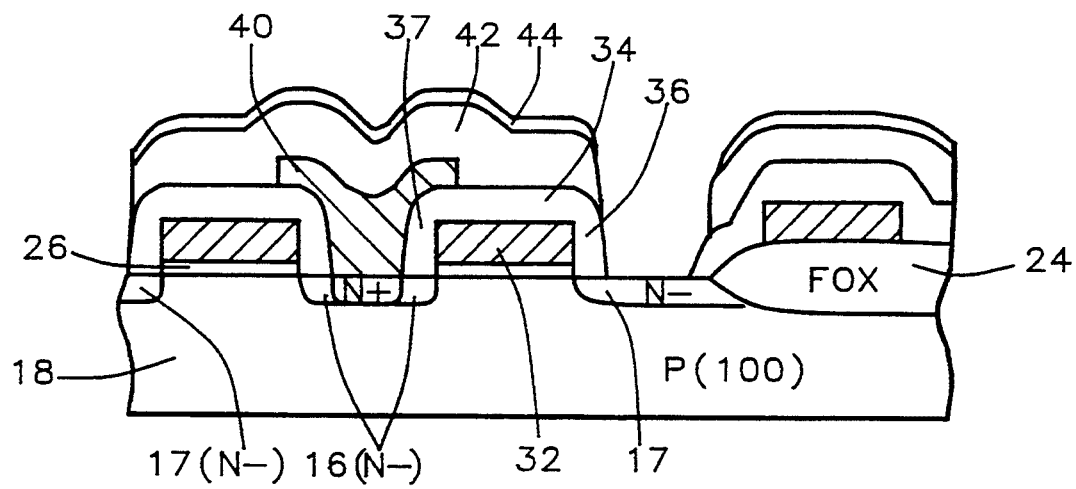
FIG. 2 is a cross-sectional view of the DRAM cell of FIG. 1 showing the additional steps of depositing a silicon oxide/silicon nitride insulating layer having an opening for the node contact of the stacked capacitor.

Now referring to FIG. 2, the bit line is insulated by depositing a first insulating layer 42 which may be formed by a chemical vapor deposition (CVD) of silicon oxide, followed by a deposition of a second insulating layer 44 of silicon nitride. The preferred thickness of the silicon oxide layer 42 is from about 1000 to 4000 Angstroms, and the preferred thickness of the silicon nitride layer 44 is from about 200 to 1000 Angstroms. The preferred deposition process for the silicon oxide is performed in a low pressure chemical vapor deposition (LPCVD) reactor at a temperature in the range between about 300° to 500° C. The process of choice for the silicon nitride is also a deposition in a LPCVD reactor at a temperature in the range of between about 650° to 800° C.

Still referring to FIG. 2, a conventional photolithographic technique and etching is used to define the contact opening to the second source/drain contact of each of the MOSFET in the array of cells. These openings are anisotropically etched in the silicon oxide/silicon nitride layers to the silicon surface, providing the node contacts for the bottom capacitor electrode. To avoid over etching the silicon in the source/drain contact, a high selectivity etch can be used. For example, such as reactive ion etching with a gas mixture of carbon tetrafluoride and hydrogen.

Figure 3:
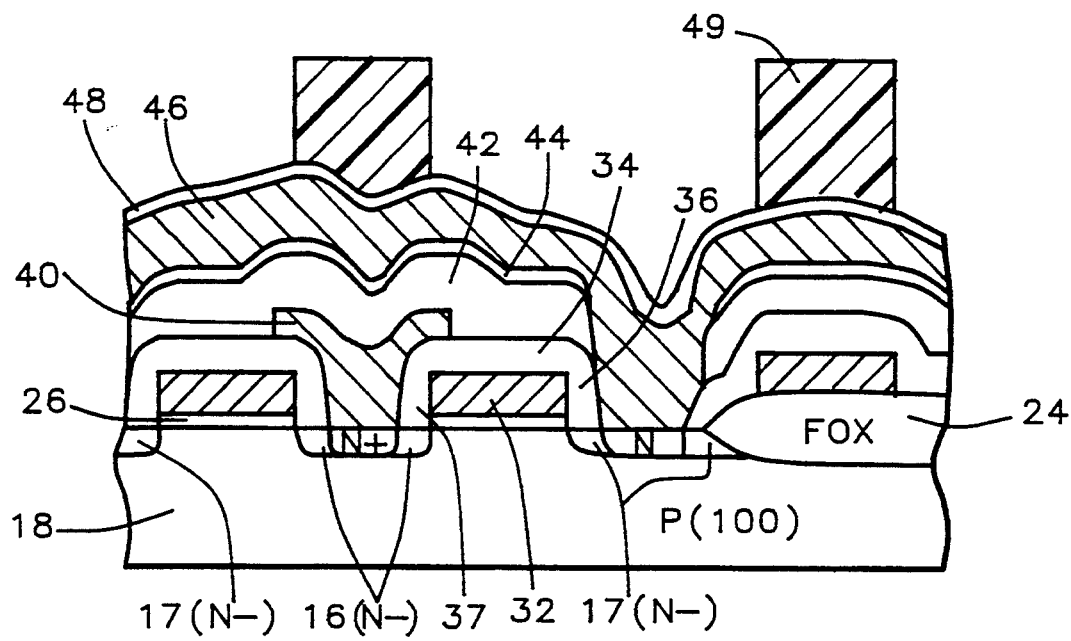
FIG. 3 is a cross-sectional view of the DRAM cell of FIG. 2 showing the additional steps of depositing the bottom electrode polysilicon, a second silicon nitride layer and the patterned photoresist layer for removing selectively the second silicon nitride layer over the capacitor areas.

Referring now to FIG. 3, a first polysilicon layer 46 is deposited over the second insulating layer 44 and in the node contact openings. The array of bottom capacitor electrodes are now formed from this layer. The first polysilicon layer 46 is relatively thick to allow for a thermal oxidation that will later consume a portion of this polysilicon layer 46. This thicker polysilicon layer 46 also increases the capacitance because of the increase in sidewall area of the capacitor. The preferred thickness of the polysilicon layer 46 is between about 2000 to 10,000 Angstroms. This polysilicon layer 46 can be doped in situ during deposition. Alternatively, the polysilicon can be deposited undoped and then implanted to achieve the desired dopant concentration. The preferred dopant is of a N-type dopant species and having a concentration in the range of between about 1 E 18 to 1 E 20 atoms/cm$^3$. The deposition process of choice being in a LPCVD reactor.

Next, as shown in FIG. 3, a third insulating layer 48 is deposited consisting of silicon nitride and providing a good thermal oxidation barrier. Alternatively, a thin silicon oxide can be deposited first and then the silicon nitride layer deposited. The preferred thickness for the silicon oxide is between about 200 to 1000 Angstroms and the preferred thickness for the silicon nitride is between about 500 to 2000 Angstroms. The silicon oxide deposition process of choice is a chemical vapor deposition (CVD) at a process temperature of between about 300° to 500° C. Alternatively, the surface of the polysilicon layer 46 can be thermally oxidized in an oxygen or oxygen/hydrogen ambient at a temperature between about 800° to 900° C. The process of choice for silicon nitride deposition is a CVD process a process temperature in the range of between 600° to 800° C.

Still referring to FIG. 3, the array of bottom electrodes are now formed from this polysilicon layer 46. Conventional photolithography techniques are used to define electrode areas over and aligned to the node contacts, exposing the silicon nitride in the electrode area and retaining the photoresist 49 in the areas between and around the electrode areas. The silicon nitride layer 48 is now anisotropically etched and the photoresist 49 is chemically stripped forming an array of exposed polysilicon areas having an oxidation resistant silicon nitride patterned layer 48 formed between and around each exposed polysilicon electrode area.

Figure 4A:
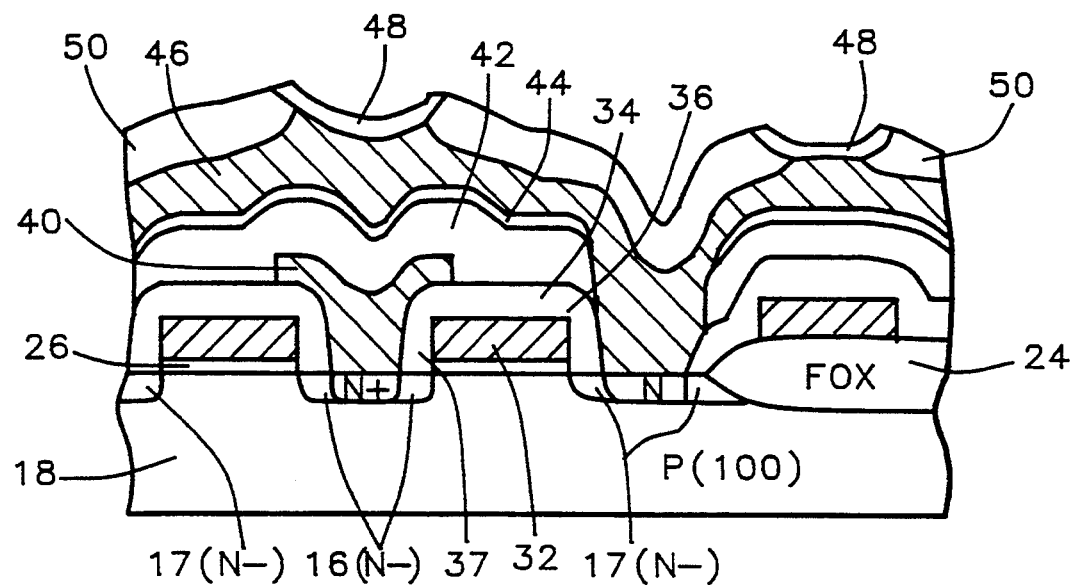
FIG. 4A is a cross-sectional view of the DRAM cell of FIG. 3 showing the additional steps of silicon nitride etching, photo resist removal and oxidation of the bottom electrode polysilicon over the capacitor area and extending under the silicon nitride region between adjacent capacitors.
Figure 4B:
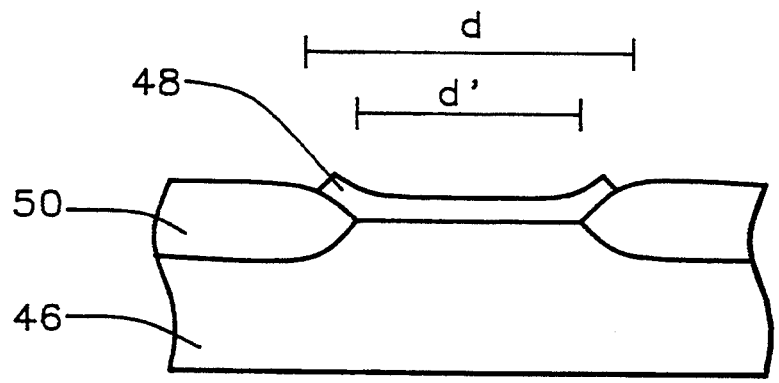
FIG. 4B shows a more detailed cross-sectional of the silicon nitride layer region between two adjacent bottom electrode. The partial oxidation extending laterally under the silicon nitride layer, reducing the spacing from d to d'.

Referring next to FIG. 4A, the exposed polysilicon layer 46 is now thermally oxidized vertically downward and also laterally under the silicon nitride layer 48, partially consuming the first polysilicon layer 46 and forming a thermal oxide layer 50 over each capacitor electrode. The preferred thickness of the thermal oxide layer 50 is between about 2000 to 4000 Angstroms and the lateral encroachment of the thermal oxide under the silicon nitride layer 48 is between about 1000 to 2000 Angstroms. This lateral oxidation reduces the spacing between adjacent electrodes from d to d', as shown in greater detail in FIG. 4B, as will be made clear later when the thermal oxide layer 50 is used as a mask to define the bottom electrode of the storage capacitor. This technique effectively extends the resolution of the photoresist 49 used to originally define the silicon nitride pattern 48. The preferred thermal oxidation process is in an oxygen/hydrogen ambient using either a conventional or high pressure thermal oxidation furnace at a temperature between about 700° to 900° C.

Figure 4C:
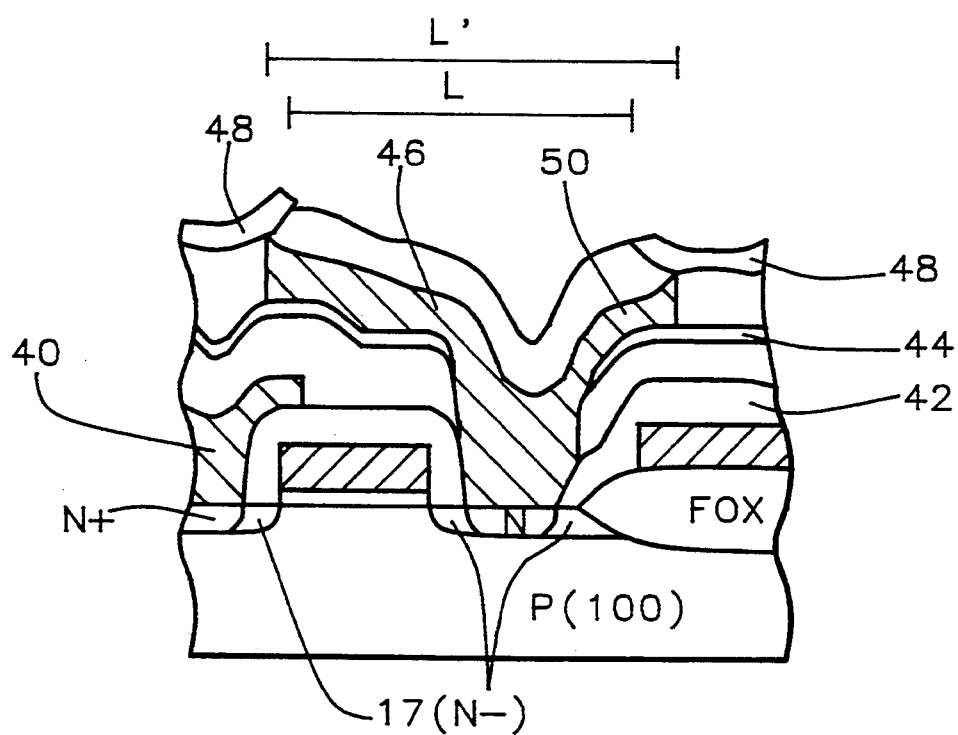
FIG. 4C shows an enlarged cross-sectional view of the oxidation layer over the electrode region and under the silicon nitride edge depicting the increase in electrode dimension from L to L'.
Figure 5:
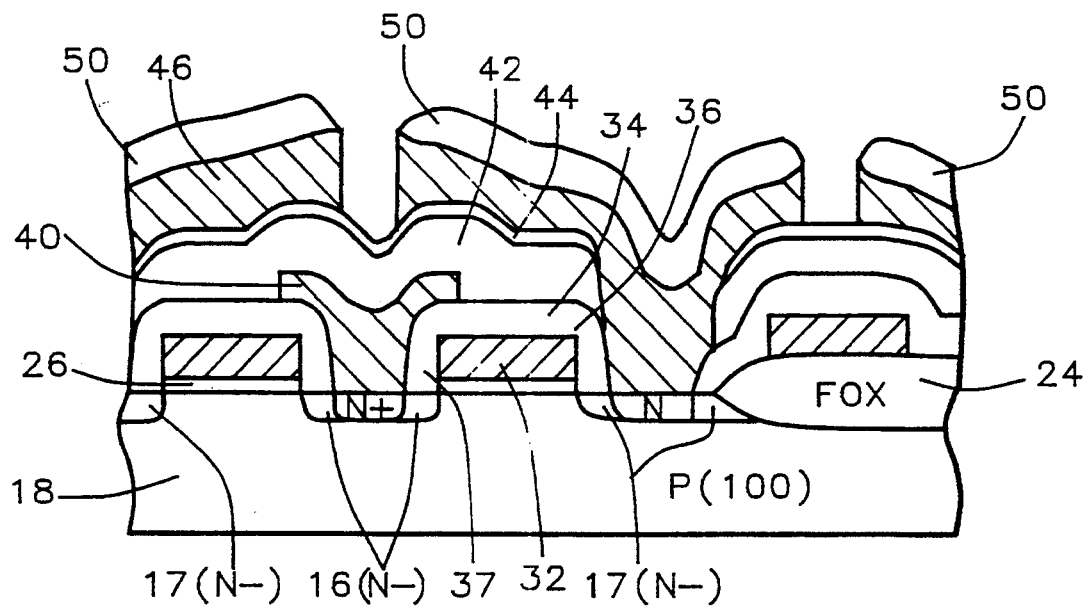
FIG. 5 is a cross-sectional view of the FIG. 4A after removing the silicon nitride and anisotropically etching the exposed polysilicon layer between electrodes to complete and electrically isolate the individual bottom electrodes. Only portions of two adjacent electrodes are shown.

Now referring to FIG. 5, the remaining silicon nitride 48 is completely removed, for example, by etching in a hot phosphoric acid at a temperature in the range between about 140° to 180° C. This exposes the underlying first polysilicon layer 46 leaving portions of the thermally oxidized polysilicon layer as an etch mask for forming the bottom electrodes of the array of storage capacitors. The capacitor increases in size from L to L', as shown in FIG. 4C. The vertical broken lines in FIG. 4C show the increase in the polysilicon electrode after the silicon nitride layer 48 is removed and the polysilicon layer 46 is selectively etched. Next, the exposed first polysilicon layer 46 is selectively and anisotropically etched to the first silicon nitride layer 44, forming an array of bottom electrodes. These electrodes are electrically isolated from each other, aligned to and making contact to the source/drain node contacts of the MOSFETs.

Figure 6:
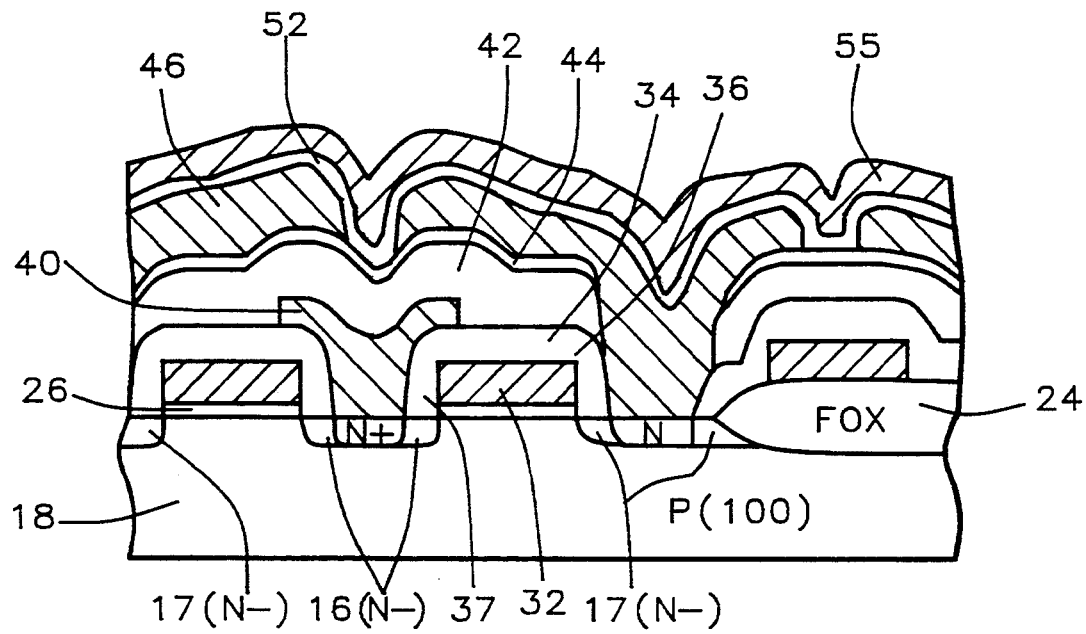
FIG. 6 shows a cross-sectional view after completing the capacitor array structure by removing the polysilicon oxidation layer 50 and depositing a high dielectric inter-electrode insulator and a continuous top polysilicon electrode.

Referring now to FIG. 6, the thermal oxide layer 50 is totally removed using an isotropic etch, for example, by etching in a hydrofluoric acid solution. Next a thin dielectric layer 52, having a high dielectric constant, is deposited on and around the bottom electrodes forming the inter-electrode dielectric. Preferably the dielectric layer 52 is composed of a silicon oxide/silicon nitride layers having a total thickness of between about 40 to 150 Angstroms. Alternatively, other insulating materials having a high dielectric constant can also be used, such as tantalum pentoxide ($Ta_2O_5$), $Ba_{1-x}Sr_xTiO_3$ (BST) and silicon oxide/silicon nitride/silicon oxide.

Also shown in FIG. 6, a second polysilicon layer 55 is deposited forming the top electrode of the array of storage capacitors and completing the array of DRAM storage cells. The preferred thickness of polysilicon 55 is from between about 2000 to 6000 Angstroms and is doped with N-type impurity, such as arsenic and phosphorus species. The preferred concentration being in the range between about 1 E 19 to 1 E 21 atoms/cm$^3$.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an array of closely spaced storage capacitors over a semiconductor substrate having an array of device regions, word lines and bit lines formed thereon comprising the steps of:

depositing a first insulating layer on said substrate and electrically isolating said word lines and bit lines;

depositing a second insulating layer on said first insulating layer being a different insulating material and forming a diffusion barrier;

masking and anisotropically etching an array of openings in said second and first insulating layers to said device contacts in and on said array of active device regions;

depositing a first polysilicon layer over said second insulating layer and over and in said array of openings making contact to said device contacts;

depositing a third insulating layer over said first polysilicon layer and forming a diffusion barrier to oxidation;

masking and anisotropically etching said third insulating layer to surface of said first polysilicon layer forming an array of exposed polysilicon areas over and aligned to said array of active device regions and to said device contact openings;

thermally and partially oxidizing said first polysilicon layer in said array of exposed polysilicon areas and laterally under said third insulating layer;

removing completely said third insulating layer between and around said array of oxidized regions exposing said first polysilicon layer;

anisotropically and selectively etching said first polysilicon layer to said second insulating layer forming an array of closely spaced and completely and electrically isolated bottom capacitor electrodes formed from said first polysilicon layer;

removing completely said oxidized regions over said array of bottom capacitor electrodes and forming a capacitor dielectric layer over and around said bottom capacitor electrodes;

depositing a second polysilicon layer over said capacitor dielectric layer forming the top capacitor electrode and completing the array of stacked storage capacitors aligned to said array of device regions and individually and electrically contacting said device contacts.

2. The method of claim 1, wherein said first insulating layer is composed of silicon oxide formed by chemical vapor deposition and having a thickness from about 1000 to 4000 Angstroms.

3. The method of claim 1, wherein said second layer is composed of silicon nitride having a thickness range from about 200 to 1000 Angstroms.

4. The method of claim 1, wherein said array of contact openings are formed comprising the steps of photo resist masking and anisotropic etching.

5. The method of claim 1, wherein said first polysilicon layer is deposited by chemical vapor deposition and having a thickness of about 2000 to 10000 Angstroms.

6. The method of claim 5, wherein said first polysilicon layer is in situ doped N-type having a concentration of between about 1 E 18 to 1 E 20 atoms/cm$^3$.

7. The method of claim 5, wherein said first polysilicon layer is deposited undoped and then implanted N-type having a concentration of between 1 E 18 to 1 E 20 atoms/cm$^3$.

8. The method of claim 1, wherein said array of exposed polysilicon areas are formed comprising the steps photo resist masking and anisotropic etching said third insulating layer.

9. The method of claim 1, wherein said partial thermal oxide layer in said exposed polysilicon area has a thickness of about from 2000 to 4000 Angstroms.

10. The method of claim 9, wherein said thermal oxidation is performed in an oxygen/hydrogen ambient in a temperature range of about 700° to 900° C.

11. The method of claim 1, wherein said third insulating layer is removed using a hot phosphoric acid etch having a temperature in the range from about 140° to 180° C.

12. The method of claim 1, wherein said first polysilicon layer is etched in a reactive plasma etcher having a high etch selectivity of polysilicon to silicon nitride.

13. The method of claim 1, wherein said thermal oxidized regions of said first polysilicon layer are removed by etching in hydrofluoric acid.

14. The method of claim 1, wherein said capacitor dielectric layer is silicon oxide/silicon nitride.

15. The method of claim 1, wherein said second polysilicon layer is deposited using chemical vapor deposition and having a thickness of about 2000 to 6000 Angstroms.

16. The method of claim 15, wherein said second polysilicon layer is doped in situ N-type having a concentration in the range of about 1 E 19 to 1 E 21 atoms/cm$^3$.

17. The method of claim 15, wherein said second polysilicon layer is deposited undoped and then implanted having a concentration of about 1 E 19 to 1 E 21 atoms/cm$^3$.

18. The method of claim 1, wherein said active device regions have metal-oxide-semiconductor field-effect transistors with source/drain regions.

19. The method of claim 18, wherein said device contacts are said source/drain regions of said metal-oxide-semiconductor field-effect-transistor forming the capacitor node contacts of the array of storage capacitors and completing the array of dynamic random access memory cells.

20. A method for fabricating an array of DRAM cells with an array of Field Effect Transistor (MOSFET) having source/drains and an array of closely spaced stacked storage capacitors formed on and in a semiconductor substrate therein comprising the steps of forming said array of closely spaced storage capacitors:

depositing a first insulating layer on said substrate electrically isolating word lines and bit lines;

depositing a second insulating layer on said first insulating layer being a different insulating material and forming a diffusion barrier;

masking and anisotropically etching an array of opening in said second and first insulating layers to said source/drains of said array of MOSFETs;

depositing a first polysilicon layer over said second insulating layer and over and in said array of openings making contact to said source/drains;

depositing a third insulating layer over said first polysilicon layer forming a diffusion barrier to oxidation;

masking and anisotropically etching said third insulating layer to surface of said first polysilicon layer forming an array of exposed polysilicon areas over and aligned to said array of MOSFET and to said source/drains;

thermally and partially oxidizing first polysilicon layer in said array of exposed polysilicon areas and laterally under said third insulating layer;

removing completely said third insulating layer between and around said array of oxidized regions exposing said first polysilicon layer;

anisotropically and selectively etching said first polysilicon layer to said second insulating layer forming an array of closely spaced and completely and electrically isolated bottom capacitor electrodes formed from said first polysilicon layer;

removing completely said oxidized regions over said array of bottom capacitor electrodes and forming a capacitor dielectric layer over and between said bottom capacitor electrodes;

depositing a second polysilicon layer over said capacitor dielectric layer forming the top capacitor electrode and completing an array of stacked storage capacitors aligned to said array of MOSFET and individually and electrically contacting said source/drains.

21. The method of claim 20, wherein said first insulating layer is composed of silicon oxide formed by chemical vapor deposition and having a thickness from about 1000 to 4000 Angstroms.

22. The method of claim 20, wherein said second layer is composed of silicon nitride having a thickness in the range from about 200 to 1000 Angstroms.

23. The method of claim 20, wherein said array of contact openings are formed comprising the steps of photo resist masking and anisotropic etching.

24. The method of claim 20, wherein said first polysilicon layer is deposited by chemical vapor deposition and having a thickness of about 2000 to 10000 Angstroms.

25. The method of claim 24, wherein said first polysilicon layer is in situ doped N-type having a concentration from between about 1 E 18 to 1 E 20 atoms/cm$^3$.

26. The method of claim 24, wherein said first polysilicon layer is deposited undoped and then implanted N-type having a concentration from between about 1 E 18 to 1 E 20 atoms/cm$^3$.

27. The method of claim 20, wherein said array of exposed polysilicon areas are formed comprising the steps photo resist masking and anisotropic etching said third insulating layer.

28. The method of claim 20, wherein said partial thermal oxide layer in said exposed polysilicon area has a thickness of about from 2000 to 4000 Angstroms.

29. The method of claim 28, wherein said thermal oxidation is performed in an oxygen/hydrogen ambient having a temperature range of about 700° to 900° C.

30. The method of claim 20, wherein said third insulating layer is removed by hot phosphoric acid etching having a temperature in the range from about 140° to 180° C.

31. The method of claim 20, wherein said first polysilicon layer is etched in a reactive plasma etcher having a high etch selectivity of polysilicon to silicon nitride.

32. The method of claim 20, wherein said oxidized regions are removed by hydrofluoric acid etching.

33. The method of claim 20, wherein said capacitor dielectric layer is silicon oxide/silicon nitride.

34. The method of claim 20, wherein said second polysilicon layer is deposited using chemical vapor deposition and having a thickness of about 2000 to 6000 Angstroms.

35. The method of claim 34, wherein said second polysilicon layer is doped in situ N-type having a concentration in the range of about 1 E 19 to 1 E 21 atoms/cm$^3$.

36. The method of claim 35, wherein said second polysilicon layer is deposited undoped and then implanted having a concentration of about 1 E 19 to 1 E 21 atoms/cm$^3$.

37. The method of claim 20, wherein said array of storage capacitor are formed over and aligned to said array of metal-oxide-semiconductor field-effect transistors and making electrical contact to said source/drains 38. The method of claim 20, wherein said array of storage capacitors contact said array of metal-oxide-semiconductor field-effect transistor source/drains completing said array of dynamic random access memory cells.

* * * * *